United States Patent
Wen et al.

(10) Patent No.: US 12,035,554 B2
(45) Date of Patent: Jul. 9, 2024

(54) ORGANIC ELECTROLUMINESCENT DEVICE AND MANUFACTURING METHOD THEREOF

(71) Applicant: BOE TECHNOLOGY GROUP CO., LTD., Beijing (CN)

(72) Inventors: Xiangmin Wen, Beijing (CN); Xing Fan, Beijing (CN); Yan Fan, Beijing (CN); Hao Gao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 463 days.

(21) Appl. No.: 17/483,290

(22) Filed: Sep. 23, 2021

(65) Prior Publication Data
US 2022/0231251 A1 Jul. 21, 2022

(30) Foreign Application Priority Data
Jan. 19, 2021 (CN) .......................... 202110070364.7

(51) Int. Cl.
| | |
|---|---|
| *H10K 50/16* | (2023.01) |
| *H10K 71/16* | (2023.01) |
| *H10K 85/30* | (2023.01) |
| *H10K 85/60* | (2023.01) |
| *H05B 33/22* | (2006.01) |
| *H10K 50/155* | (2023.01) |
| *H10K 101/30* | (2023.01) |

(52) U.S. Cl.
CPC .......... *H10K 50/16* (2023.02); *H10K 71/164* (2023.02); *H05B 33/22* (2013.01); *H10K 50/155* (2023.02); *H10K 85/324* (2023.02); *H10K 85/6572* (2023.02); *H10K 2101/30* (2023.02)

(58) Field of Classification Search
CPC .... H10K 50/16; H10K 71/164; H10K 85/324; H10K 85/6572; H10K 2101/30; H10K 2101/40; H10K 50/11; H10K 2101/80; H10K 71/00; H10K 50/155; H05B 33/22
See application file for complete search history.

(56) References Cited

U.S. PATENT DOCUMENTS

| | | | | |
|---|---|---|---|---|
| 2004/0222739 | A1* | 11/2004 | Chen ...................... | H10K 50/14 |
| | | | | 313/506 |
| 2012/0199837 | A1* | 8/2012 | Kobayashi ........... | H10K 50/155 |
| | | | | 257/59 |
| 2016/0336519 | A1* | 11/2016 | Seo ........................ | H10K 50/11 |
| 2017/0301880 | A1* | 10/2017 | Pei ......................... | H10K 50/80 |

\* cited by examiner

*Primary Examiner* — Patricia D Valenzuela
(74) *Attorney, Agent, or Firm* — Myers Bigel, P.A.

(57) ABSTRACT

The present disclosure provides an organic electroluminescent device and a manufacturing method thereof. The organic electroluminescent device includes an anode, an electron transport layer and a cathode. The material of the electron transport layer includes a mixture of a first electron transport material and a second electron transport material, the lowest unoccupied molecular orbital energy level of the first electron transport material is higher than that of the second electron transport material, and the ratio of the first electron transport material to the second electron transport material first decreases and then increases in the direction from the cathode to the anode.

20 Claims, 6 Drawing Sheets

ORGANIC ELECTROLUMINESCENT DEVICE AND MANUFACTURING METHOD THEREOF

RELATED APPLICATION

The present application claims the benefit of Chinese Patent Application No. 202110070364.7 filed on Jan. 19, 2021, the entire disclosure of which is incorporated herein by reference.

TECHNICAL FIELD

The present disclosure relates to the field of electronic device technology, specifically to an organic electroluminescent device and manufacturing method thereof.

BACKGROUND

Organic light emitting diodes (OLEDs) are widely used in display technology due to their advantages of lightness, thinness, high contrast, flexibility, short response time, and so on.

In an organic light emitting diode device, the LUMO energy level is a very important parameter. It can be known from the device design theory that the energy level matching between the functional layers greatly influences carrier injection and transmission, thereby affecting the efficiency and lifetime of the device. Reducing the bombardment of electrons at the interface between the light emitting layer and the electron transport layer is the direction to increase the lifetime of an organic light emitting diode.

Promoting carrier balance is an effective way to improve the efficiency of an organic light emitting diode. At present, methods for enhancing carrier balance of an OLED can mainly be classified into three directions: (1) using appropriate electron, hole injection materials to balance the injected carriers (material selection direction); (2) achieving balance by improving the structure of the device (device structure direction); (3) improving electron, hole transport materials, such as adding or deleting certain functional groups in the molecular structure, to thereby change the mobility of carriers in organic transport materials so as to achieve balance (material design and synthesis direction).

SUMMARY

In view of the above-mentioned deficiencies or shortcomings in the prior art, it is desirable to provide an organic electroluminescent device and a manufacturing method thereof, which can promote carrier balance and improve the efficiency of an organic light emitting diode.

In a first aspect, the present disclosure provides an organic electroluminescent device comprising an anode, an electron transport layer and a cathode; a material of the electron transport layer comprises a mixture of a first electron transport material and a second electron transport material; a lowest unoccupied molecular orbital energy level of the first electron transport material is higher than that of the second electron transport material; a ratio of the first electron transport material to the second electron transport material first decreases and then increases in a direction from the cathode to the anode.

Further, the organic electroluminescent device further comprises a substrate. The substrate is provided with the anode, a hole transport layer, a light emitting layer, the electron transport layer, an electron injection layer and the cathode successively.

Further, the electron transport layer comprises a first interface adjacent to the light emitting layer and a second interface adjacent to the electron injection layer. A ratio of the first electron transport material to the second electron transport material on the first interface is greater than a ratio of the first electron transport material to the second electron transport material on the second interface.

Optionally, a ratio of the first electron transport material to the second electron transport material on the electron transport layer changes in a parabolic shape.

Optionally, a ratio of the first electron transport material to the second electron transport material on the electron transport layer changes in a V-line shape.

Further, a ratio of the first electron transport material to the second electron transport material at a third interface on the electron transport layer is the lowest, from the first interface to the third interface, the ratio of the first electron transport material to the second electron transport material decreases in a curvilinear or linear shape, and from the third interface to the second interface, the ratio of the first electron transport material to the second electron transport material increases in a curvilinear or linear shape.

Optionally, the ratio of the first electron transport material to the second electron transport material is a molar ratio of the first electron transport material to the second electron transport material.

Optionally, the ratio of the first electron transport material to the second electron transport material is a weight ratio of the first electron transport material to the second electron transport material.

Optionally, the first electron transport material comprises at least one of $Alq_3$, BPhen, Balq, BCP and TPBi.

Optionally, the second electron transport material comprises at least one of $Alq_3$, BPhen, Balq, BCP and TPBi.

In a second aspect, the present disclosure provides a method of manufacturing an organic electroluminescent device, the organic electroluminescent device being an organic electroluminescent device described in any of the foregoing embodiments. The method comprises: performing evaporative preparation of the electron transport layer by vacuum thermal evaporation.

Optionally, the evaporative preparation employs line source evaporation, the line source scans both the first electron transport material and the second electron transport material at a uniform speed at a same interface, and a scanning speed of the line source for the first electron transport material is proportional to a scanning speed of the line source for the second electron transport material; during an evaporation process of the line source from the first interface to the second interface, evaporation rates of the line source for the first electron transport material and the second electron transport material are fixed, and a ratio of scanning speeds of the line source for the first electron transport material and the second electron transport material first decreases and then increases.

Further, a variation trend of the ratio of scanning speeds is the same as a variation trend of the ratio of the first electron transport material to the second electron transport material.

Optionally, the evaporative preparation employs point source evaporation, a position of the point source is fixed, when preparation is performed at a same interface, evaporation rates for the first electron transport material and the second electron transport material are at a certain ratio, and during an evaporation process from the first interface to the second interface, a ratio of evaporation rates of the line source for the first electron transport material and the second electron transport material first decreases and then increases Further, a variation trend of the ratio of evaporation rates for the first electron transport material and the second electron transport material is the same as a variation trend of the ratio of the first electron transport material to the second electron transport material.

Further, the method further comprises: forming the anode, the hole transport layer, the light emitting layer, the electron transport layer, the electron injection layer and the cathode on the substrate.

Optionally, the ratio of the first electron transport material to the second electron transport material is a molar ratio of the first electron transport material to the second electron transport material.

Optionally, the ratio of the first electron transport material to the second electron transport material is a weight ratio of the first electron transport material to the second electron transport material.

Optionally, the first electron transport material comprises at least one of $Alq_3$, BPhen, Balq, BCP and TPBi.

Optionally, the second electron transport material comprises at least one of $Alq_3$, BPhen, Balq, BCP and TPBi.

BRIEF DESCRIPTION OF THE DRAWINGS

By reading the detailed description of the non-limiting embodiments with reference to the following drawings, other features, purposes and advantages of the present disclosure will become more apparent.

DETAILED DESCRIPTION

The present disclosure will be further described in detail below with reference to the drawings and embodiments. It can be understood that the specific embodiments described herein are only used to explain the present disclosure, but not to limit it. In addition, it is to be further noted that, to facilitate description, only the portions related to the present disclosure are shown in the drawings.

It is to be noted that the embodiments in the present disclosure and the features in the embodiments can be combined with each other in the case of causing no conflict. Hereinafter, the present disclosure will be described in detail with reference to the drawings and in conjunction with the embodiments.

Referring to FIGS. 1-4, the present disclosure provides an organic electroluminescent device. The organic electroluminescent device comprises an anode 100, an electron transport layer 400, and a cathode 600. The material of the electron transport layer 400 includes a mixture of a first electron transport material ETM1 and a second electron transport material ETM2. The LUMO energy level of the first electron transport material ETM1 is higher than the LUMO energy level of the second electron transport material ETM2. The ratio of the first electron transport material ETM1 to the second electron transport material ETM2 first decreases and then increases in the direction from the cathode 600 to the anode 100.

In the organic electroluminescent device provided by the embodiment of the present disclosure, the LUMO energy level of the electron transport layer is adjusted by spatially adjusting the ratio of the first electron transport material to the second electron transport material. As a result, not only the electron injection and transmission of the electron transport layer can be improved to improve carrier balance of an OLED device, but also the bombardment of electrons on the electron transport layer/light emitting layer interface can be alleviated, thereby improving the efficiency and lifetime of the OLED device.

Optionally, the ratio of the first electron transport material to the second electron transport material is a molar ratio of the first electron transport material to the second electron transport material.

Optionally, the ratio of the first electron transport material to the second electron transport material is a weight ratio of the first electron transport material to the second electron transport material.

The organic electroluminescent device may comprise a substrate. The substrate is successively provided with the anode 100, a hole transport layer (HTL) 200, a light emitting layer (EML) 300, an electron transport layer (ETL) 400, an electron injection layer (EIL) 500, and the cathode 600.

The electron transport layer 400 includes a first interface 1 adjacent to the light emitting layer 300 and a second interface 2 adjacent to the electron injection layer 500. The ratio of the first electron transport material ETM1 to the second electron transport material ETM2 on the first interface 1 is greater than that of the first electron transport material ETM1 to the second electron transport material ETM2 on the second interface 2.

Figure 1:
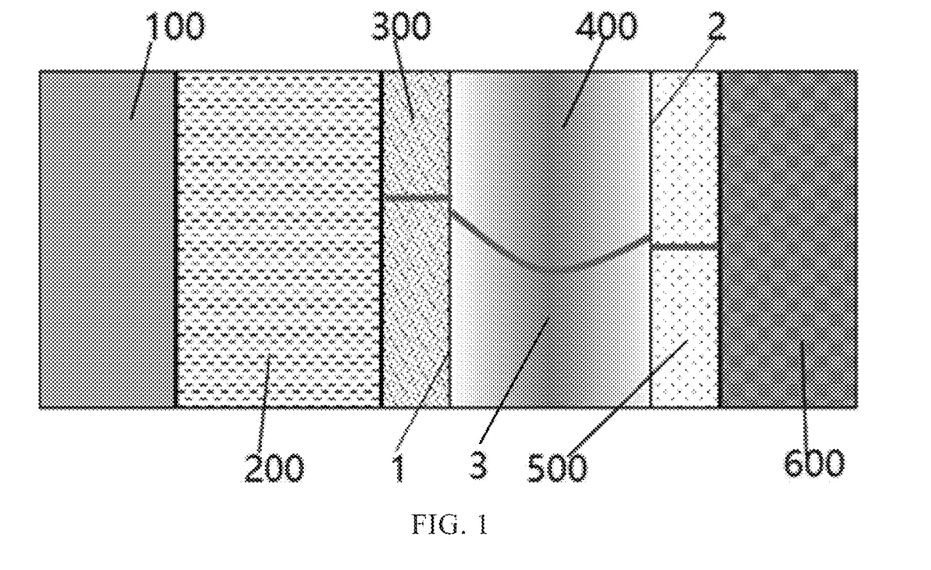
FIG. 1 is a schematic structural view of an organic electroluminescent device provided by an embodiment of the present disclosure.

In some embodiments, as shown in FIG. 1, the ratio of the first electron transport material ETM1 to the second electron transport material ETM2 on the electron transport layer 400 changes in a parabolic shape.

Figure 2:
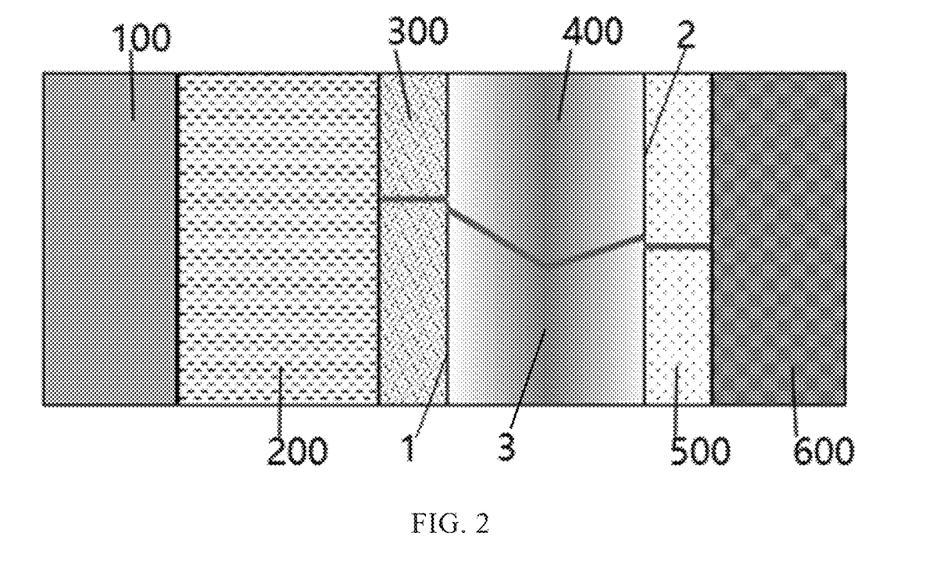
FIG. 2 is a schematic structural view of an organic electroluminescent device provided by another embodiment of the present disclosure.

In other embodiments, as shown in FIG. 2, the ratio of the first electron transport material ETM1 to the second electron transport material ETM2 on the electron transport layer 400 changes in a V-line shape.

Figure 3:
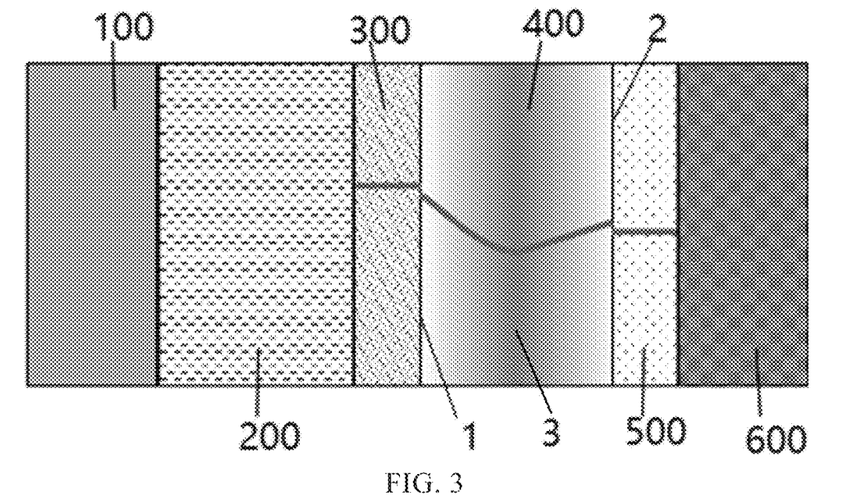
FIG. 3 is a schematic structural view of an organic electroluminescent device provided by a further embodiment of the present disclosure.

In still other embodiments, as shown in FIG. 3, the ratio of the first electron transport material ETM1 to the second electron transport material ETM2 at a third interface 3 on the electron transport layer 400 is the lowest. From the first interface 1 to the third interface 3, the ratio of the first electron transport material ETM1 to the second electron transport material ETM2 decreases curvilinearly. From the third interface 3 to the second interface 2, the ratio of the first electron transport material ETM1 to the second electron transport material ETM2 increases linearly.

As shown in FIGS. 1-6, the third interface 3 refers to a position in the electron transport layer 400 where the ratio of the first electron transport material ETM1 to the second electron transport material ETM2 is the lowest.

Figure 4:
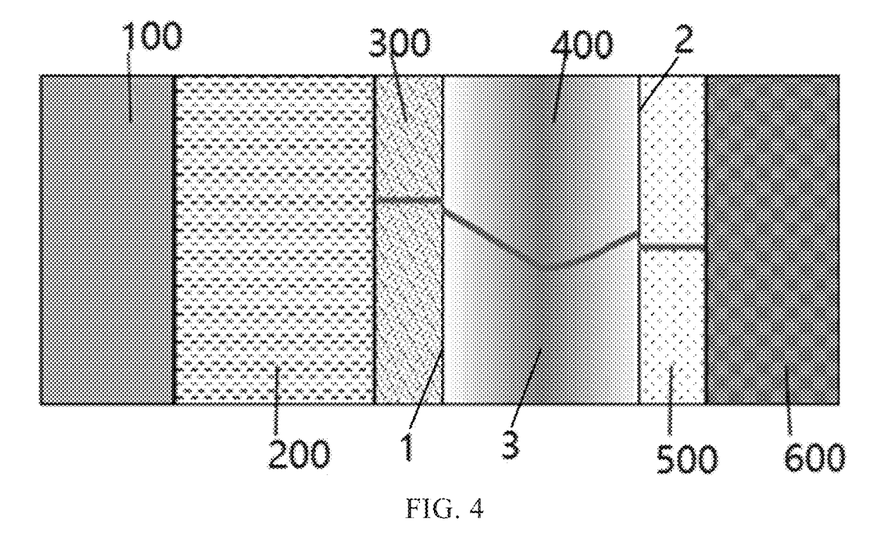
FIG. 4 is a schematic structural view of an organic electroluminescent device provided by an embodiment of the present disclosure.

In other embodiments, as shown in FIG. 4, the ratio of the first electron transport material ETM1 to the second electron transport material ETM2 at the third interface 3 on the electron transport layer 400 is the lowest. From the first interface 1 to the third interface 3, the ratio of the first electron transport material ETM1 to the second electron transport material ETM2 decreases linearly. From the third interface 3 to the second interface 2, the ratio of the first electron transport material ETM1 to the second electron transport material ETM2 increases curvilinearly.

Illustratively, for example, the LUMO energy level of the first electron transport material is −1.99 eV, and the LUMO energy level of the second electron transport material is −3.01 eV. Of course, the LUMO energy levels of the first electron transport material and the second electron transport material may also be other values, as long as the LUMO energy level of the first electron transport material is higher than that of the second electron transport material, which is not limited here.

Table 1 shows the influence of the compositional ratio of the first electron transport material and the second electron transport material on the LUMO energy level of the electron transport layer 400.

TABLE 1

| Sample | Sample 1 | Sample 2 | Sample 3 | Sample 4 |
|---|---|---|---|---|
| Composition (ETM1:ETM2) | 7:3 | 5:5 | 3:7 | 0:1 |
| LUMO (eV) | −2.28 | −2.38 | −2.4 | −3.01 |

Figure 5:
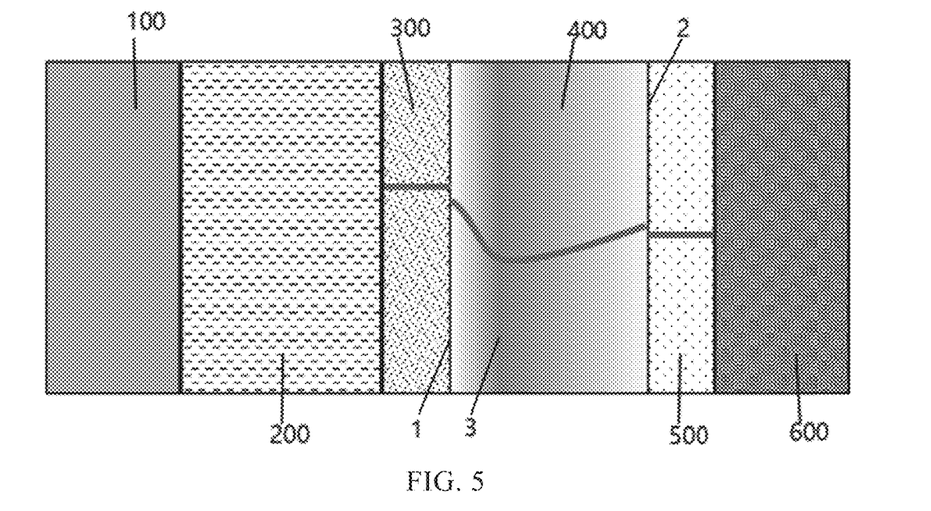
FIG. 5 is a schematic structural view of an organic electroluminescent device provided by an embodiment of the present disclosure.
Figure 6:
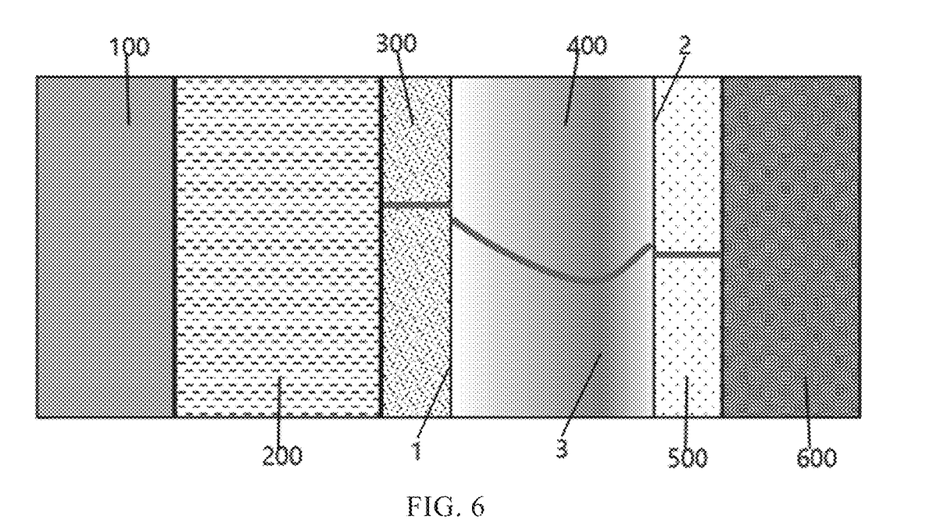
FIG. 6 is a schematic structural view of an organic electroluminescent device provided by an embodiment of the present disclosure.

The proportion of the first electron transport material in the total electron transport material first decreases and then increases toward the anode 100, and the proportion of ETM1 at the EML/ETL interface is higher than that at the ETL/EIL interface. For example, the proportion of the first electron transport material in the total electron transport material at the EIL/ETL interface is 40%-60%, and this proportion gradually decreases evenly toward the anode 100 and decreases to a minimum of 5%-15% at the third interface 3 of the electron transport layer 400. The third interface 3 is located at a certain position on the electron transport layer 400. For example, the third interface 3 may be located at a distance of 25%, 50%, or 75% from the first interface 1 to the second interface 2 (as shown in FIG. 5, FIG. 1, or FIG. 6). In the lateral direction from the first interface to the second interface, the proportion of the first electron transport material in the total electron transport material gradually increases evenly. The proportion of the first electron transport material in the total electron transport material may be 75%-95% at the EML/ETL interface.

It is to be noted that the lowest unoccupied molecular orbit (LUMO) represents an electron unoccupied orbit with the lowest energy level.

In the overall structure of the electron transport layer 400, the LUMO energy level is varied. From the first interface 1 to the second interface 2, i.e., in the direction from the anode 100 to the cathode 600, the LUMO energy level first decreases and then increases, and the LUMO energy level of the first interface 1 of the electron transport layer 400 is greater than that of the second interface 2.

In order to enable the cathode 600 to transport electrons to the light emitting layer 300 through the electron transport layer 400, the LUMO energy level of the light emitting layer 300 is higher than that of the first interface 1 of the electron transport layer 400 adjacent to the light emitting layer 300. The LUMO energy level of the second interface 2 of the electron transport layer 400 adjacent to the electron injection layer 500 is higher than that of the electron injection layer 500. In an embodiment of the present disclosure, the electron transport layer 400 may include a plurality of structural layers. Each structural layer may have a specific ratio of the first electron transport material ETM1 to the second electron transport material ETM2, so as to adjust the LUMO energy level of this structural layer. Similar to the previously described embodiment, in the direction from the anode 100 to the cathode 600, the LUMO energy levels of the plurality of structural layers also have a tendency to first decrease and then increase.

Similar to the variation trend of the material ratio, the LUMO energy level of the electron transport layer 400 may change in a parabolic shape, a V-line shape, or a combination of a curvilinear shape and a linear shape. In this variation trend, the electrons accelerate in the LUMO energy level descending segment, and the electrons decelerate in the LUMO energy level ascending segment. The more the structural layers of the electron transport layer 400 are, the smaller the difference between the LUMO energy levels of adjacent structural layers through which electrons pass will be, and the greater the electron mobility is. By making proper adjustment, it is possible to not only increase the carrier transmission speed but also reduce the bombardment of carriers at the interface of the light emitting layer 300.

At the same time, there is a small difference between the LUMO energy levels of the second interface 2 of the electron transport layer 400 and the electron injection layer 500. When electrons are transported between two layer structures, the smaller the difference between the LUMO energy levels of the two layer structures is, the greater the electron mobility will be.

The electron transport material may be selected as an organic material with an n-type property which is easily reduced and is electrochemically stable when reduced. In the embodiment of the present disclosure, the material of the electron transport layer 400 of the organic electroluminescent device may include at least one of the following: metal complexes of hydroxyquinoline derivatives represented by $Alq_3$ and Balq, various metal complexes, triazole derivatives, triazine derivatives, oxadiazole derivatives, thiadiazole derivatives, carbodiimide derivatives, quinoxaline derivatives, phenanthroline derivatives, silicon-based compound derivatives, etc.

Illustratively, the material of the electron transport layer 400 may include $Alq_3$, BPhen, Balq, BCP, or TPBi. $Alq_3$ refers to tris(8-hydroxyquinoline) aluminum. BePhen refers to 4,7-diphenyl-1,10-phenanthroline. Balq refers to bis(2-methyl-8-quinolinolato)-4-phenylphenolato-aluminum.

BCP refers to 2,9-dimethyl-4,7-diphenyl-1,10-phenanthroline. TPBI refers to 1,3,5-tris(N-phenylbenzimidazol-2-yl) benzene.

Those skilled in the art can understand that, in the present disclosure, the specific material of the first electron transport material ETM1 and the specific material of the second electron transport material ETM2 can be selected according to the requirements described in the above embodiments.

In addition, it is to be further noted that the material of the substrate may include substantially transparent glasses or polymer materials or other suitable materials. Examples of polymer materials suitable for the substrate include PET, polyacrylate, polycarbonate, polyester, polysulfone, polyetherimide, polysiloxane, epoxy resin or poly siloxane-functional epoxy resin.

The anode 100 may be a transmissive electrode, a semi-transmissive electrode or a reflective electrode. When the anode 100 is a transmissive electrode, the anode 100 may be formed using a transparent metal oxide, such as indium tin oxide (ITO), indium zinc oxide (IZO), zinc oxide (ZnO) or indium tin zinc oxide (ITZO), etc. When the anode 100 is a semi-transmissive electrode or a reflective electrode, the anode 100 may include Ag, Mg, Al, Pt, Pd, Au, Ni, Nd, Ir, Cr or a metal mixture.

The cathode 600 may be a transmissive electrode or a semi-transmissive electrode. When the cathode 600 is a transmissive electrode, the cathode 600 may be formed using a transparent metal oxide, such as indium tin oxide (ITO), indium zinc oxide (IZO), zinc oxide (ZnO) or indium tin zinc oxide (ITZO), etc. When the cathode 600 is a semi-transmissive electrode, the cathode 600 may include Ag, Mg, Al, Pt, Pd, Au, Ni, Nd, Ir, Cr or a metal mixture.

Holes and electrons are recombined in the light emitting layer 300 to form excitons. The excitons decay, thereby emitting light. The substance used for the light emitting layer 300 may be a polymer substance and a low-molecular organic material, and is selected to emit light in a desired wavelength range. The organic light emitting substance may be an organic material, such as a polymer, a copolymer, a mixture of polymers, or low molecular weight organic molecules with unsaturated bonds. These substances have a delocalized 7r-electron system, which gives polymer chains or organic molecules the ability to support positive carriers and negative carriers with high mobility.

As an example, suitable light emitting polymers include: poly(N-vinylcarbazole) ("PVK", which emits violet-blue light with a wavelength of about 380 to 500 nm) and its derivatives; polyfluorene and its derivatives, such as poly (alkylfluorene), such as poly(9,9-dihexylfluorene), poly(dioctylfluorene) or poly {9,9-bis(3,6-dioxaheptyl)-fluorene-2,7-diyl}; poly(p-phenylene) ("PPP") and its derivatives, such as poly(2-decyloxy-1,4-phenylene) or poly(2,5-diheptyl-1,4-phenylene); poly(p-phenylene vinylene) ("PPV") and its derivatives, such as dialkoxy-substituted PPV and cyano-substituted PPV; polythiophene and its derivatives, such as poly(3-alkylthiophene), poly(4,4'-dialkyl-2,2'-bithiophene (biothiophene)), poly(2,5-thienylene vinylene); poly(pyridine vinylidene) and its derivatives; polyquinoxaline and its derivatives; and polyquinoline and its derivatives. These polymers or mixtures of copolymers based on one or more of these polymers and other substances can be used to adjust the color of the emitted light.

The electron injection layer 500 is between the cathode 600 and the electron transport layer 400. Materials suitable for the electron injection layer 500 include: metal organic complexes of 8-hydroquinoline, such as tris(8-hydroquinolinato) aluminum; stilbene derivatives; anthracene derivatives; perylene derivatives; metal thioxinoid compounds; diazole derivatives and metal chelates; pyridine derivatives; pyrimidine derivatives; quinoline derivatives; quinoxaline derivatives; diphenylquinone derivatives; nitro-substituted fluorene derivatives; and triazine.

The hole transport layer 200 is between the anode 100 and the light emitting layer 300. Materials suitable for the hole transport layer 200 may include: triaryl diamine, tetraphenyl diamine, aromatic tertiary amine, hydrazone derivatives, carbazole derivatives, triazole derivatives, imidazole derivatives, diazole derivatives with amino groups and polythiophene. The hole transport layer 200 generally also has a function of blocking the transport of electrons passing through the light emitting layer 300, so that holes and electrons are optimally confined in the light emitting layer 300 and the holes and electrons are recombined in the light emitting layer 300. The hole transport layer 200 may also be referred to as a hole transport-electron blocking layer, and the terms "hole transport layer 200" and "hole transport-electron blocking layer" are used interchangeably in the present disclosure.

In a second aspect, the present disclosure provides a method of manufacturing an organic electroluminescent device, the organic electroluminescent device being any one of the organic electroluminescent devices described above. The method may comprise: performing evaporative preparation of the electron transport layer 400 by vacuum thermal evaporation.

A vacuum evaporation apparatus is provided with an evaporation source containing an evaporation material and an object such as the substrate for evaporation in the vacuum chamber. In a state where the vacuum chamber is depressurized, the evaporation source is heated to vaporize the evaporation material, and the vaporized evaporation material is deposited on the surface of the object for evaporation to form a thin film.

Figure 7:
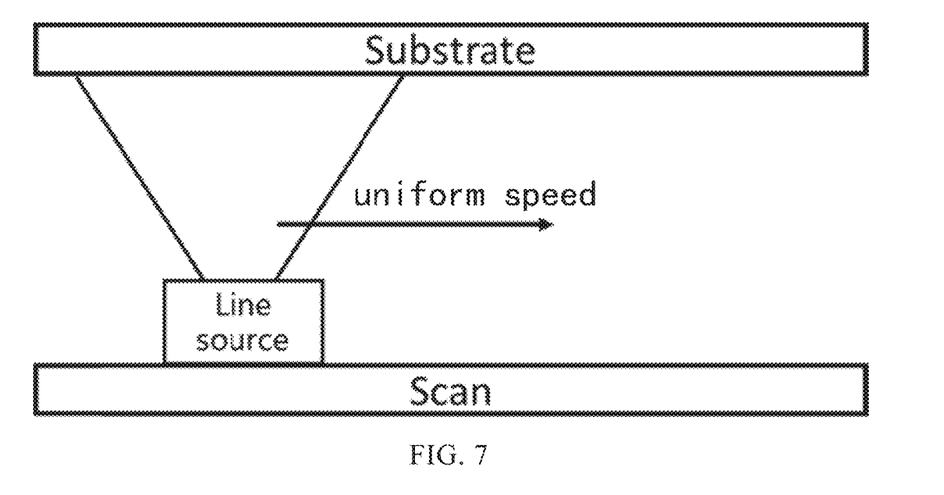
FIG. 7 is a schematic view illustrating a line source evaporation method provided by an embodiment of the present disclosure.

In an embodiment of the present disclosure, the evaporative preparation employs line source evaporation. As shown in FIG. 7, the line source scans both the first electron transport material ETM1 and the second electron transport material ETM2 at a uniform speed at the same interface. The scanning speed of the line source for the first electron transport material ETM1 is proportional to the scanning speed of the line source for the second electron transport material ETM2. During the evaporation process of the line source from the first interface 1 to the second interface 2, the evaporation rates of the line source for the first electron transport material ETM1 and the second electron transport material ETM2 are fixed, and the ratio of the scanning speeds of the line source for the first electron transport material ETM1 and the second electron transport material ETM2 first decreases and then increases.

Further, the variation trend of the ratio of the scanning speeds is the same as the variation trend of the ratio of the first electron transport material ETM1 to the second electron transport material ETM2.

It is to be noted that, an evaporation source of a "line source" or "linear source" means that the evaporation source is provided with nozzles that eject the evaporation material in the form of evaporation particles along one direction. Generally, the line source is provided with a plurality of circular nozzles to eject the evaporation material in the form of evaporation particles. The heating method for the line source and the like are not particularly limited. By applying heating on the line source, the evaporation material is ejected to the outside through the nozzle in the form of evaporation particles, and the evaporation particles are evaporated onto the underlying material through a mask plate.

For example, the evaporation rate of the transport material can be acquired by a detection system. By adjusting the scanning speed of the line source, the ratio of the first electron transport material ETM1 to the second electron transport material ETM2 on each interface can be adjusted. At the same interface, the evaporation rates for the first electron transport material ETM1 and the second electron transport material ETM2 may be fixed values respectively, marked as VT1 and VT2. When the first electron transport material ETM1 and the second electron transport material ETM2 are being evaporated, the scanning speeds of the line source may also be fixed values respectively, marked as VS1 and VS2.

As the evaporation process of the electron transport layer 400 continues, during the preparation process from the first interface 1 to the second interface 2, the ratio of the first electron transport material ETM1 to the second electron transport material ETM2 first decreases and then increases. In the embodiments of the present disclosure, the evaporation rates of each layer for the first electron transport material ETM1 and the second electron transport material ETM2 remain unchanged, that is, the evaporation rate of each layer for the first electron transport material ETM1 is the fixed value VT1 of the first interface 1, and the evaporation rate of each layer for the second electron transport material ETM2 is the fixed value VT2 of the first interface 1. The ratio of the scanning speeds (VS1:VS2) for the first electron transport material ETM1 and the second electron transport material ETM2 exhibits a tendency to first decrease and then increase. When the evaporation rate of each layer for a certain material is fixed, the faster the scanning speed is, the higher the content of the evaporated material will be in the deposited thin film.

Figure 8:
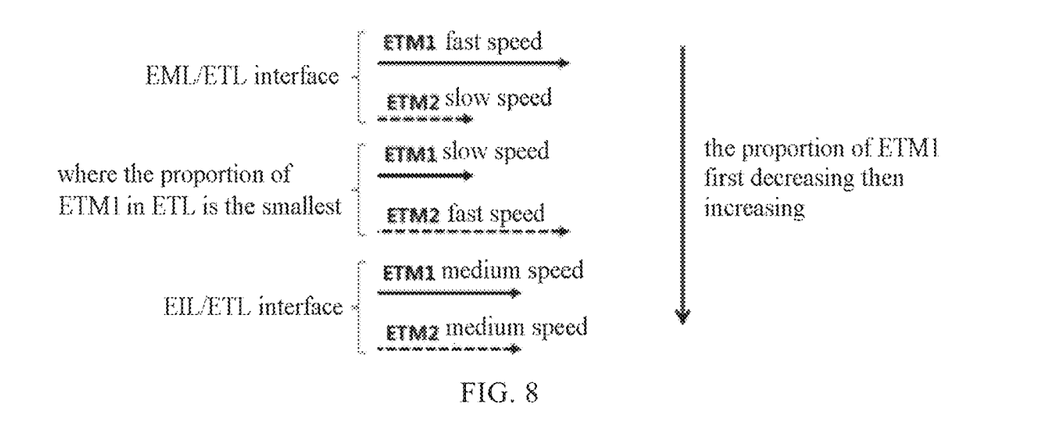
FIG. 8 is a schematic view illustrating the line source scanning speeds provided by an embodiment of the present disclosure.

Illustratively, as shown in FIG. 8, at the first interface 1, the scanning speed for ETM1 is fast, and the scanning speed for ETM2 is slow. At that time, the ratio of the scanning speeds is 3:1. During the preparation process to the second interface 2, for example, where the proportion of ETM1 is the smallest, the scanning speed for ETM1 is slow, and the scanning speed for ETM2 is fast. At that time, the ratio of the scanning speeds is 1:3. At the second interface 2, the scanning speed for ETM1 is medium, and the scanning speed for ETM2 is medium. At that time, the ratio of the scanning speeds is 2:2.

It is to be noted that in this embodiment, for various transport materials, the "point source" adopts a mode of performing evaporation and scanning respectively. In other embodiments, it is also possible to adjust the evaporation rate according to the ratio of the components in a film to be evaporated. For example, the evaporation chamber has a plurality of evaporation positions, atoms/molecules generated at the plurality of evaporation positions pass through a confluence port and are mixed at the confluence port to form a mixed deposition source, and scanning is performed at a certain scanning speed. The compositional ratio of the evaporation material realized by any line source scanning method falls within the protection scope of the embodiment of the present disclosure.

In addition, it is to be further noted that, in an embodiment of the present disclosure, the function formula between thickness and scanning speed is obtained through multiple tests, that is, a correspondence relation (function formula) between the scanning position data and the scanning speed is obtained through the relationship between the thickness distribution data and the scanning position data (such as scanning coordinate data) of each evaporation zone. The scanning speed is adjusted according to the relationship between the scanning speed and the thickness, and/or according to the thickness requirements.

In addition, the line source evaporation mechanism may also be rotated by an appropriate angle to improve the uniformity of the film thickness after evaporation, which will not be described in detail in the embodiment of the present disclosure.

Figure 9:
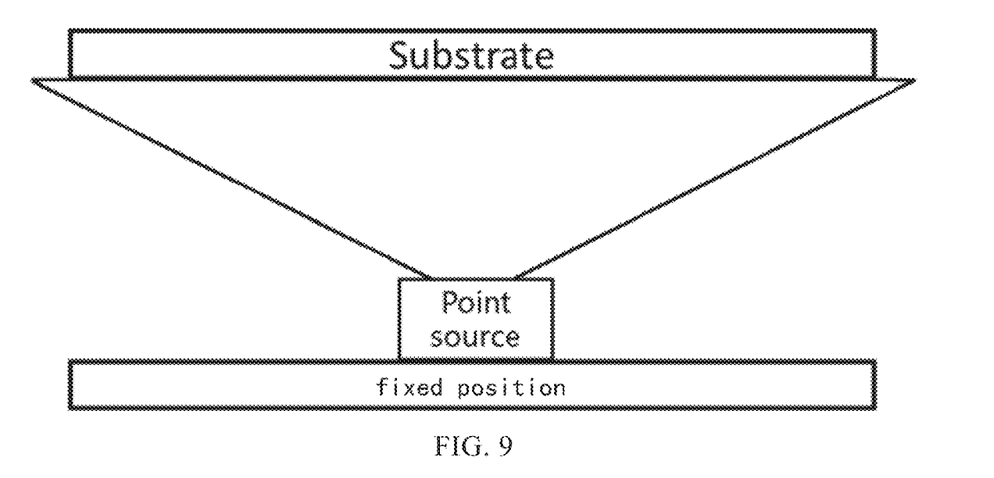
FIG. 9 is a schematic view illustrating a point source evaporation method provided by an embodiment of the present disclosure.

In another embodiment of the present disclosure, the evaporative preparation employs point source evaporation. As shown in FIG. 9, the position of the point source is fixed. When preparation is performed at the same interface, the evaporation rates for the first electron transport material ETM1 and the second electron transport material ETM2 are adjusted to VT3 and VT4 respectively through the evaporation position. During the evaporation process from the first interface 1 to the second interface 2, the ratio of the evaporation rates (VT3:VT4) of the line source for the first electron transport material ETM1 and the second electron transport material ETM2 first decreases and then increases.

Further, the variation trend of the ratio of the evaporation rates for the first electron transport material ETM1 and the second electron transport material ETM2 is the same as the variation trend of the ratio of the first electron transport material ETM1 to the second electron transport material ETM2.

Figure 10:
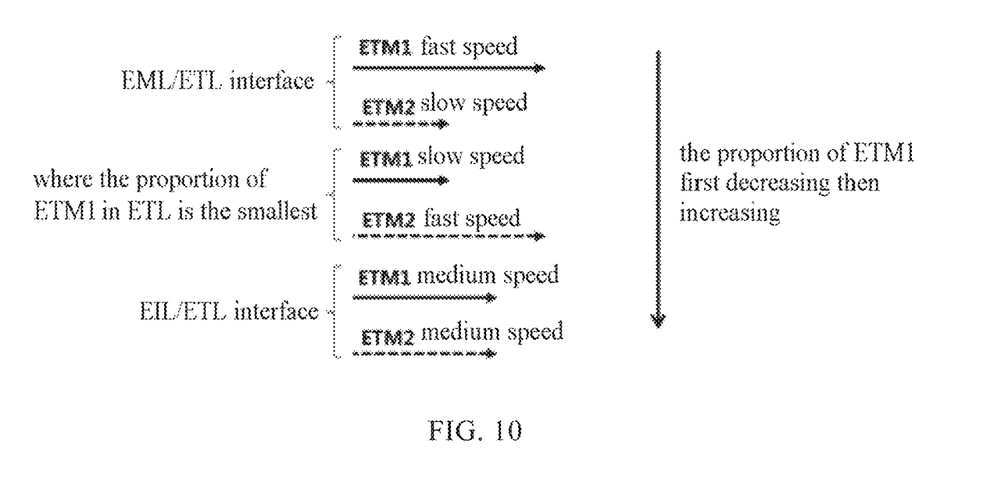
FIG. 10 is a schematic view illustrating the point source evaporation rates provided by an embodiment of the present disclosure.

Illustratively, as shown in FIG. 10, at the first interface 1, the evaporation rate for ETM1 is fast, and the evaporation rate for ETM2 is slow. At that time, the ratio of the evaporation rates is 3:1. During the preparation process to the second interface 2, for example, where the proportion of ETM1 is the smallest, the evaporation rate for ETM1 is slow, and the evaporation rate for ETM2 is fast. At that time, the ratio of the evaporation rates is 1:3. At the second interface 2, the evaporation rate for ETM1 is medium, and the evaporation rate for ETM2 is medium. At that time, the ratio of the evaporation rates is 2:2.

It is to be noted that in the embodiment of the present disclosure, corresponding point source nozzles can be disposed for various types of transport materials. Since the position of the point source is fixed, the ratio of the components can be adjusted by adjusting the evaporation rate. Of course, it is also possible to set a plurality of evaporation positions. Atoms/molecules generated at the plurality of evaporation positions pass through a confluence port and are mixed at the confluence port to form a mixed deposition source, which is ejected through a point source nozzle. The compositional ratio of the evaporation material realized by any point source evaporation method falls within the protection scope of the embodiment of the present disclosure. It is to be noted that the specific form of the relationship between the position of the point source and the evaporation rate should be set according to actual situations, then the thickness of the film to be formed and the ratio of the components may be adjusted.

It is to be noted that the evaporation rate calculation method includes directly measuring the thickness of the evaporation film or calculating the evaporation rate through the vapor amount of the evaporation substance. For example, by irradiating light to the vaporized evaporation substance, the evaporation rate of the evaporation substance is calculated using polarized light. Of course, the evaporation rate may also be calculated using changes in the film thickness during the evaporation process. Of course, the methods listed in the embodiment of the present disclosure are merely illustrative. Upon implementation, the evaporation rate can be calculated and adjusted according to the type of equipment. The calculation and adjustment of the evaporation rate in the present disclosure are not limited to a certain embodiment.

When a point source is applied to large area evaporation, it is required to take into account the uniformity of mass production, the source-to-substrate distance, the off-axis location, the effective material utilization rate, the deposition rate, etc. This will not be described in detail in the embodiments of the present disclosure.

In an embodiment of the present disclosure, a method of manufacturing an organic electroluminescent device comprises: forming the anode 100, the hole transport layer 200, the light emitting layer 300, the electron transport layer 400, the electron injection layer 500 and the cathode 600 on the substrate.

Specifically, the method comprises the following steps.

S01, forming an anode 100 on the substrate. The anode 100 may be deposited on the underlying substrate by physical vapor deposition, chemical vapor deposition or sputtering.

S02, forming a hole transport layer 200 on the anode 100. The hole transport layer 200 may be applied on the elements of the underlying anode 100 by methods such as spray coating, dip coating, spin coating, screen printing, physical or chemical vapor deposition, and the like.

S03, forming a light emitting layer 300 on the hole transport layer 200. A luminescent substance is subjected to physical or chemical vapor deposition, spin coating, dip coating, spray coating, inkjet printing, gravure coating, flexographic coating, screen printing or tape casting, and the substance is polymerized (if necessary) or the substance is cured subsequently, and deposited on the elements of the underlying hole transport layer 200.

S04, forming an electron transport layer 400 on the light emitting layer 300. The electron transport layer 400 may be formed on the elements of the underlying light emitting layer 300 by point source evaporation or line source evaporation.

S05, forming an electron injection layer 500 on the electron transport layer 400. The electron injection layer 500 may be applied on the elements of the underlying electron transport layer 400 by methods such as spray coating, dip coating, spin coating, screen printing, physical or chemical vapor deposition, and the like.

S06, forming a cathode 600 on the electron injection layer 500. The cathode 600 can be deposited on the elements of the underlying electron injection layer 500 by physical vapor deposition, chemical vapor deposition or sputtering.

Figure 11:
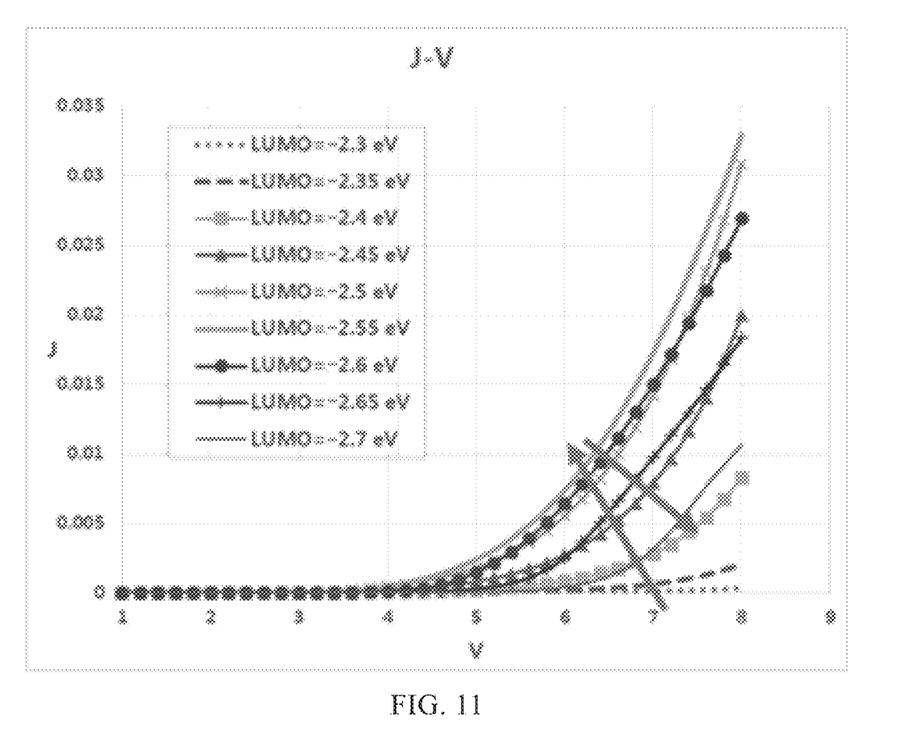
FIG. 11 shows the simulation results of the LUMO values of various ETLs with a fixed ratio of ETM1 to ETM2 obtained by adjusting the ratio.
Figure 12:
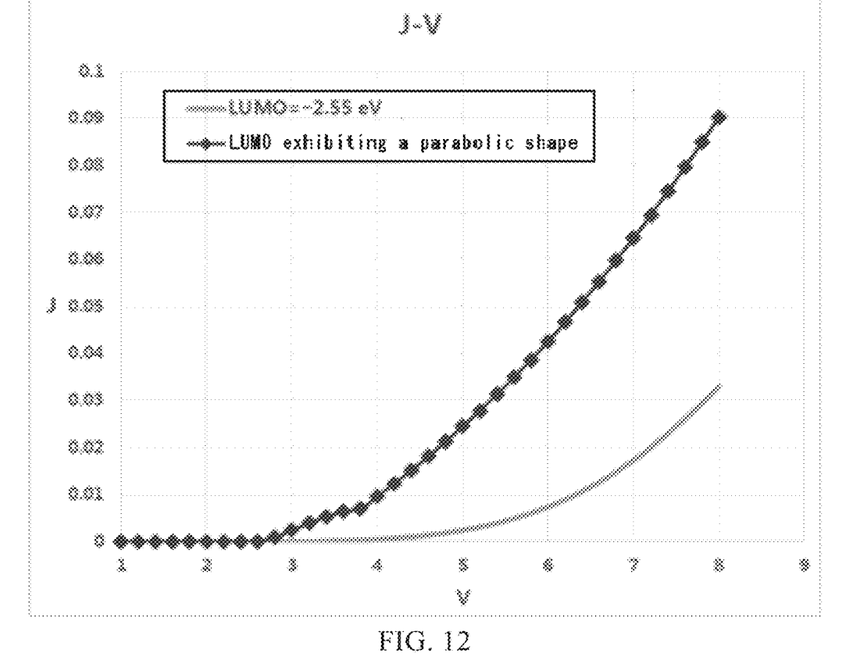
FIG. 12 shows a comparison between simulated J-V curves of optimal LUMO values of an ETL in which the ratio exhibits a parabolic shape and an ETL with a fixed ratio.
Figure 13:
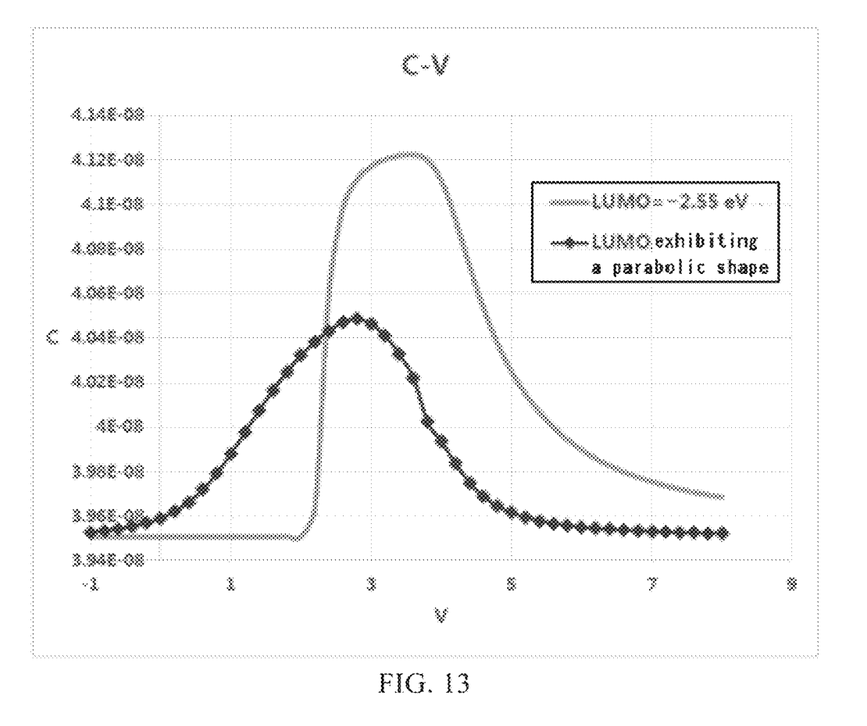
FIG. 13 shows a comparison between simulated C-V curves of optimal LUMO values of an ETL in which the ratio exhibits a parabolic shape and an ETL with a fixed ratio.

By modulating and adjusting the ratio of ETM1 to ETM2, a variety of uniformly mixed electron transport layers ETLs with a fixed ratio of ETM1 to ETM2 can be obtained, and the LUMO value may take any fixed value from the LUMO value of ETM2 to the LUMO value of ETM1. The J-V curves (current density-voltage curves) obtained by simulating such an OLED device are illustrated in FIG. 11. It can be seen from the simulation results that the current density-voltage curve is optimal when the LUMO energy level of a uniformly mixed electron transport layer ETL with a fixed ratio of ETM1 to ETM2=−2.55 eV. Simulation is performed for an OLED device with the electron transport layer 400 in which the ratio of ETM1 to ETM2 changes in a parabolic shape provided by an embodiment of the present disclosure. According to the J-V simulation results, the J-V curve (current density-voltage curve) of the embodiment of the present disclosure is better than the optimal J-V curve of the OLED device with a uniformly mixed electron transport layer with a fixed ratio of ETM1 to ETM2 (of which the LUMO energy level is −2.55 eV), as shown in FIG. 12 (current density-voltage curve). The C-V simulation results show that the organic electroluminescent device provided by the embodiment of the present disclosure has a smaller starting voltage, a smaller capacitance at the peak, and a faster response speed, as shown in FIG. 13 (capacitance-voltage curve).

It should be understood that the orientations or positional relationships indicated by the terms "length", "width", "upper", "lower", "front", "rear", "left", "right", "vertical", "horizontal", "top", "bottom", "inner", "outer", etc. are based on the orientations or positional relationships shown in the drawings, which are only for the convenience of describing the present disclosure and simplifying the description, rather than indicating or implying the denoted device or element must have a specific orientation, be constructed and operated in a specific orientation, and therefore cannot be understood as a limitation to the present disclosure.

In addition, the terms "first" and "second" are only used for descriptive purposes, and cannot be understood as indicating or implying relative importance or implicitly indicating the number of indicated technical features. Thus, the features defined with "first" and "second" may explicitly or implicitly include one or more of these features. In the description of the present disclosure, "plurality" means two or more, unless it is specifically defined otherwise.

Unless otherwise defined, the technical and scientific terms used herein have the same meanings as commonly understood by those skilled in the technical field of the present disclosure. The terms used herein are only for describing specific implementation purposes, and are not intended to limit the present disclosure. Terms such as "set" appearing herein may indicate that one component is directly attached to another component, or that one component is attached to another component through an intermediate component. A feature described in one embodiment herein may be applied in another embodiment alone or in combination with other features, unless the feature is not applicable in the other embodiment or otherwise stated.

The present disclosure has been described through the above embodiments, but it should be understood that the above embodiments are only for exemplificative and illustrative purposes, and are not intended to limit the present disclosure to the scope of the described embodiments. Those skilled in the art can understand that more variations and modifications can be made according to the teachings of the present disclosure, and these variations and modifications all fall within the scope of protection claimed by the present disclosure.

What is claimed is:

1. An organic electroluminescent device comprising:
an anode;
an electron transport layer; and
a cathode, wherein a material of the electron transport layer comprises a mixture of a first electron transport material and a second electron transport material,
wherein a lowest unoccupied molecular orbital energy level of the first electron transport material is higher than that of the second electron transport material;
wherein a ratio of the first electron transport material to the second electron transport material first decreases and then increases in a direction from the cathode to the anode; and
wherein a ratio of the first electron transport material to the second electron transport material at a third interface in the electron transport layer is lowest.

2. The organic electroluminescent device according to claim 1, further comprising:
a substrate,
wherein the substrate is provided with the anode, a hole transport layer, a light emitting layer, the electron transport layer, an electron injection layer and the cathode successively.

3. The organic electroluminescent device according to claim 2,
wherein the electron transport layer comprises a first interface adjacent to the light emitting layer and a second interface adjacent to the electron injection layer, and
wherein a ratio of the first electron transport material to the second electron transport material on the first interface is greater than a ratio of the first electron transport material to the second electron transport material on the second interface.

4. The organic electroluminescent device according to claim 3, wherein a ratio of the first electron transport material to the second electron transport material on the electron transport layer changes in a parabolic shape.

5. The organic electroluminescent device according to claim 3, wherein a ratio of the first electron transport material to the second electron transport material on the electron transport layer changes in a V-line shape.

6. The organic electroluminescent device according claim 3,
wherein from the first interface to the third interface, the ratio of the first electron transport material to the second electron transport material decreases in a curvilinear or linear shape, and
wherein from the third interface to the second interface, the ratio of the first electron transport material to the second electron transport material increases in a curvilinear or linear shape.

7. The organic electroluminescent device according to claim 1, wherein the ratio of the first electron transport material to the second electron transport material is a molar ratio of the first electron transport material to the second electron transport material.

8. The organic electroluminescent device according to claim 1, wherein the ratio of the first electron transport material to the second electron transport material is a weight ratio of the first electron transport material to the second electron transport material.

9. The organic electroluminescent device according to claim 1, wherein the first electron transport material comprises at least one of $Alq_3$, BPhen, Balq, BCP, or TPBi.

10. The organic electroluminescent device according to claim 1, wherein the second electron transport material comprises at least one of $Alq_3$, BPhen, Balq, BCP, or TPBi.

11. A method of manufacturing the organic electroluminescent device according to claim 3, comprising:
performing evaporative preparation of the electron transport layer by vacuum thermal evaporation.

12. The method of manufacturing the organic electroluminescent device according to claim 11,
wherein the evaporative preparation employs line source evaporation, a line source scans both the first electron transport material and the second electron transport material at a uniform speed at a same interface, and a scanning speed of the line source for the first electron transport material is proportional to a scanning speed of the line source for the second electron transport material, and
wherein during an evaporation process of the line source from the first interface to the second interface, evaporation rates of the line source for the first electron transport material and the second electron transport material are fixed, and a ratio of scanning speeds of the line source for the first electron transport material and the second electron transport material first decreases and then increases.

13. The method of manufacturing the organic electroluminescent device according to claim 12, wherein a variation trend of the ratio of scanning speeds is same as a variation trend of the ratio of the first electron transport material to the second electron transport material.

14. The method of manufacturing the organic electroluminescent device according to claim 11,
wherein the evaporative preparation employs point source evaporation, and a position of a point source is fixed,
wherein when preparation is performed at a same interface, evaporation rates for the first electron transport material and the second electron transport material are at a certain ratio, and
wherein during an evaporation process from the first interface to the second interface, a ratio of evaporation rates of a line source for the first electron transport material and the second electron transport material first decreases and then increases.

15. The method of manufacturing the organic electroluminescent device according to claim 14, wherein a variation trend of the ratio of evaporation rates for the first electron transport material and the second electron transport material is same as a variation trend of the ratio of the first electron transport material to the second electron transport material.

16. The method of manufacturing the organic electroluminescent device according to claim 11, further comprising:
forming the anode, a hole transport layer, a light emitting layer, the electron transport layer, an electron injection layer and the cathode on a substrate.

17. The method of manufacturing the organic electroluminescent device according to claim 11, wherein the ratio of the first electron transport material to the second electron transport material is a molar ratio of the first electron transport material to the second electron transport material.

18. The method of manufacturing the organic electroluminescent device according to claim 11, wherein the ratio of the first electron transport material to the second electron transport material is a weight ratio of the first electron transport material to the second electron transport material.

19. The method of manufacturing the organic electroluminescent device according to claim 11, wherein the first electron transport material comprises at least one of $Alq_3$, BPhen, Balq, BCP, or TPBi.

20. The method of manufacturing the organic electroluminescent device according to claim 11, wherein the second electron transport material comprises at least one of $Alq_3$, BPhen, Balq, BCP, or TPBi.

* * * * *